(12) United States Patent
Suzuki et al.

(10) Patent No.: US 9,541,847 B2
(45) Date of Patent: Jan. 10, 2017

(54) IMPRINT METHOD AND IMPRINT SYSTEM

(75) Inventors: Masato Suzuki, Yokohama (JP);
Takuya Kono, Yokosuka (JP); Manabu Takakuwa, Yokohama (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1081 days.

(21) Appl. No.: 13/529,617

(22) Filed: Jun. 21, 2012

(65) Prior Publication Data
US 2013/0020741 A1 Jan. 24, 2013

(30) Foreign Application Priority Data

Jul. 21, 2011 (JP) ................................ 2011-159746

(51) Int. Cl.
*B29C 59/16* (2006.01)
*G03F 9/00* (2006.01)
*G03F 7/00* (2006.01)
*B82Y 10/00* (2011.01)
*B82Y 40/00* (2011.01)
*B29C 43/02* (2006.01)

(52) U.S. Cl.
CPC ............. *G03F 9/7042* (2013.01); *B82Y 10/00* (2013.01); *B82Y 40/00* (2013.01); *G03F 7/0002* (2013.01); *B29C 2043/025* (2013.01)

(58) Field of Classification Search
CPC ........ B82Y 10/00; B82Y 40/00; G03F 7/0002; G03F 9/7042; B29C 2043/025; B29C 35/08; B29C 35/0805; B29C 2035/0827
See application file for complete search history.

(56) References Cited

U.S. PATENT DOCUMENTS 4,352,706 A * 10/1982 Miller ................... B41M 3/006
156/230
7,815,424 B2 10/2010 Nakamura et al.
(Continued)

FOREIGN PATENT DOCUMENTS

CN 1981236 A 6/2007
CN 101101441 1/2008
(Continued)

OTHER PUBLICATIONS

Notification of the First Office Action issued by the State Intellectual Property Office of the People's Republic of China on Dec. 13, 2013, for Chinese Patent Application No. 201210211232.2, and English-language translation thereof.
(Continued)

*Primary Examiner* — Yogendra Gupta
*Assistant Examiner* — Emmanuel S Luk
(74) *Attorney, Agent, or Firm* — Finnegan, Henderson, Farabow, Garrett & Dunner LLP

(57) ABSTRACT

According to one embodiment, an imprint method comprises coating a photo-curable organic material on a film to be processed, bringing a concave-convex pattern of a template into contact with the photo-curable organic material, applying a force to the template in such a state that the template is brought into contact with the photo-curable organic material, curing the photo-curable organic material by irradiating light onto the photo-curable organic material, in such a state that the template is brought into contact with the photo-curable organic material, and releasing the template from the photo-curable organic material after the light irradiation. The force applied to the template corresponds to a gap between a surface of the film to be processed and the template.

5 Claims, 5 Drawing Sheets

(56) References Cited

U.S. PATENT DOCUMENTS

| | | | |
|---|---|---|---|
| 8,741,199 | B2 | 6/2014 | Lan et al. |
| 2004/0007799 | A1* | 1/2004 | Choi et al. .................. 264/494 |
| 2005/0270516 | A1 | 12/2005 | Cherala et al. |
| 2007/0160937 | A1* | 7/2007 | Ogino et al. .................. 430/311 |
| 2007/0248892 | A1* | 10/2007 | Rangelow ............ G03F 9/7038 430/5 |
| 2008/0099941 | A1 | 5/2008 | Suehira et al. |
| 2008/0129925 | A1* | 6/2008 | Han ................. B29D 11/00663 349/65 |
| 2009/0283938 | A1 | 11/2009 | Suehira et al. |
| 2010/0102487 | A1* | 4/2010 | Schumaker ............ B82Y 10/00 264/408 |
| 2010/0148397 | A1 | 6/2010 | Nakamura et al. |
| 2010/0197044 | A1* | 8/2010 | Kajiyama ................ G11C 11/16 438/3 |
| 2010/0237045 | A1 | 9/2010 | Koshiba et al. |
| 2011/0001254 | A1* | 1/2011 | Kruijt-Stegeman ... B82Y 10/00 264/40.5 |
| 2011/0216294 | A1* | 9/2011 | Menchtchikov .... G03F 7/70616 355/53 |
| 2011/0226735 | A1* | 9/2011 | Wuister ................. B82Y 10/00 216/41 |
| 2012/0044470 | A1* | 2/2012 | Smilde ...................... G03F 1/44 355/53 |
| 2012/0299222 | A1 | 11/2012 | Lan et al. |
| 2013/0069278 | A1* | 3/2013 | Kobayashi ............ G03F 7/0002 264/319 |
| 2014/0017614 | A1* | 1/2014 | Schaper ................ G03F 7/0035 430/323 |
| 2014/0071413 | A1* | 3/2014 | Takakuwa ........... G03F 7/70775 355/52 |
| 2014/0340660 | A1* | 11/2014 | Suzuki .................. G03F 7/0002 355/53 |

FOREIGN PATENT DOCUMENTS

| | | |
|---|---|---|
| CN | 102096315 | 6/2011 |
| JP | 2006-165371 | 6/2006 |
| JP | 2007-139752 | 6/2007 |
| JP | 2010-225693 | 10/2010 |
| JP | 2010-260272 | 11/2010 |
| JP | 2010-274639 | 12/2010 |
| KR | 10-2009-0111562 | 10/2009 |
| TW | I304025 | 12/2008 |
| TW | I338196 | 3/2011 |
| WO | WO 2005/121892 A2 | 12/2005 |

OTHER PUBLICATIONS

Office Action issued by the Taiwan Patent Office for Application No. 101120810, dated Dec. 24, 2014 (Taiwanese language and English translation (6 pgs.)).

Notification of Second Office Action issued by the State Intellectual Property Office of the People's Republic of China on Aug. 1, 2014, for Chinese Patent Application No. 201210211232.2, and English-language translation thereof.

Notification of Reason for Rejection issued by the Japanese Patent Office on May 17, 2013, for Japanese Patent Application No. 2011-159746, and English-language translation thereof.

Notification of Reasons for Rejection issued by the Korean Intellectual Property Office on Aug. 27, 2013, for Korean Patent Application No. 10-2012-66633, and English-language translation thereof.

Notification of Third Office Action issued by the State Intellectual Property Office of the People's Republic of China on Feb. 11, 2015, for Chinese Patent Application No. 201210211232.2, and English-language translation thereof.

* cited by examiner

IMPRINT METHOD AND IMPRINT SYSTEM

CROSS-REFERENCE TO RELATED APPLICATION

This application is based upon and claims the benefit of priority from the Japanese Patent Application No. 2011-159746, filed on Jul. 21, 2011, the entire contents of which are incorporated herein by reference.

FIELD

Embodiments described herein relate generally to an imprint method and an imprint system.

BACKGROUND

As technology for forming fine patterns at a low cost, an optical nanoimprint method is known. As for the optical nanoimprint method, a template having unevenness corresponding to patterns to be formed on a substrate is pressed against a photo-curable organic material layer coated on a surface of the substrate, and the organic material layer is cured by light irradiation. The template is released from the organic material layer to transcribe patterns.

When the template is pressed again the photo-curable organic material, alignment between the template and the substrate is carried out using an alignment mark on the substrate and an alignment mark of the template. Also, there is known a method that reduces the misalignment of positions, at which transcription patterns are to be formed, by pressurizing the template from left and right and correcting the shape of the template. However, even though the same photo-curable organic material is used, the fluidity of the photo-curable organic material varies depending on a processing condition. Therefore, there has been a problem that it is difficult to improve the alignment accuracy of the transcription patterns, without performing an optimal shape correction on the template.

DETAILED DESCRIPTION

According to one embodiment, an imprint method comprises coating a photo-curable organic material on a film to be processed, bringing a concave-convex pattern of a template into contact with the photo-curable organic material, applying a force to the template in such a state that the template is brought into contact with the photo-curable organic material, curing the photo-curable organic material by irradiating light onto the photo-curable organic material, in such a state that the template is brought into contact with the photo-curable organic material, and releasing the template from the photo-curable organic material after the light irradiation. The force applied to the template corresponds to a gap between a surface of the film to be processed and the template.

Embodiments will now be explained with reference to the accompanying drawings.

Figure 1A:
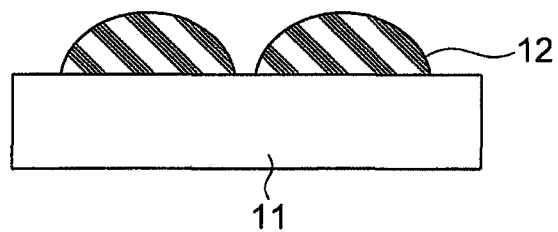
FIGS. 1A to 1C are process cross-sectional views illustrating an imprint method.
Figure 1B:
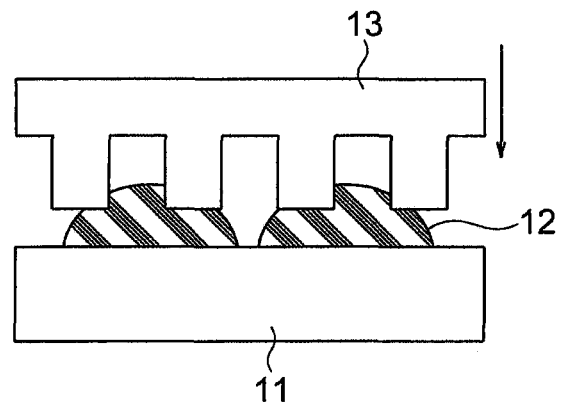

First, an imprint method will be described. The imprint method, as illustrated in FIG. 1A, coats an imprint material 12 on a substrate 11. Thereafter, as illustrated in FIG. 1B, a template 13 having unevenness corresponding to a pattern to be formed is brought into contact with the coated imprint material 12. The imprint material 12 is, for example, a liquid photo-curable organic material, such as acrylic monomer or the like. Alignment marks for position adjustment are formed in the substrate 11 and the template 13, respectively, and alignment is performed by scanning the substrate 11 or the template 13 with reference to the alignment marks.

Figure 1C:
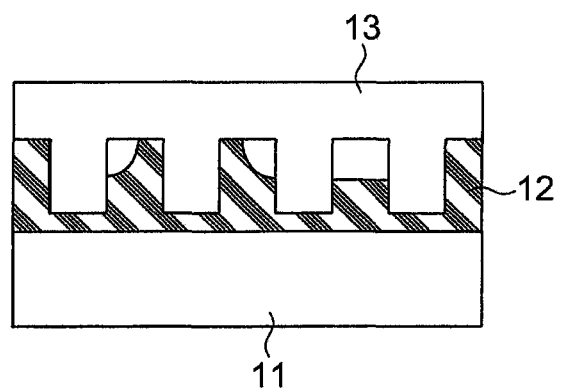

As illustrated in FIG. 1C, the liquid imprint material 12 flows in along the uneven (concave-convex) pattern of the template 13. In this case, the template 13 is pressurized using a pressurizing mechanism (not illustrated), and the shape of the template 13 is corrected.

Figure 2:
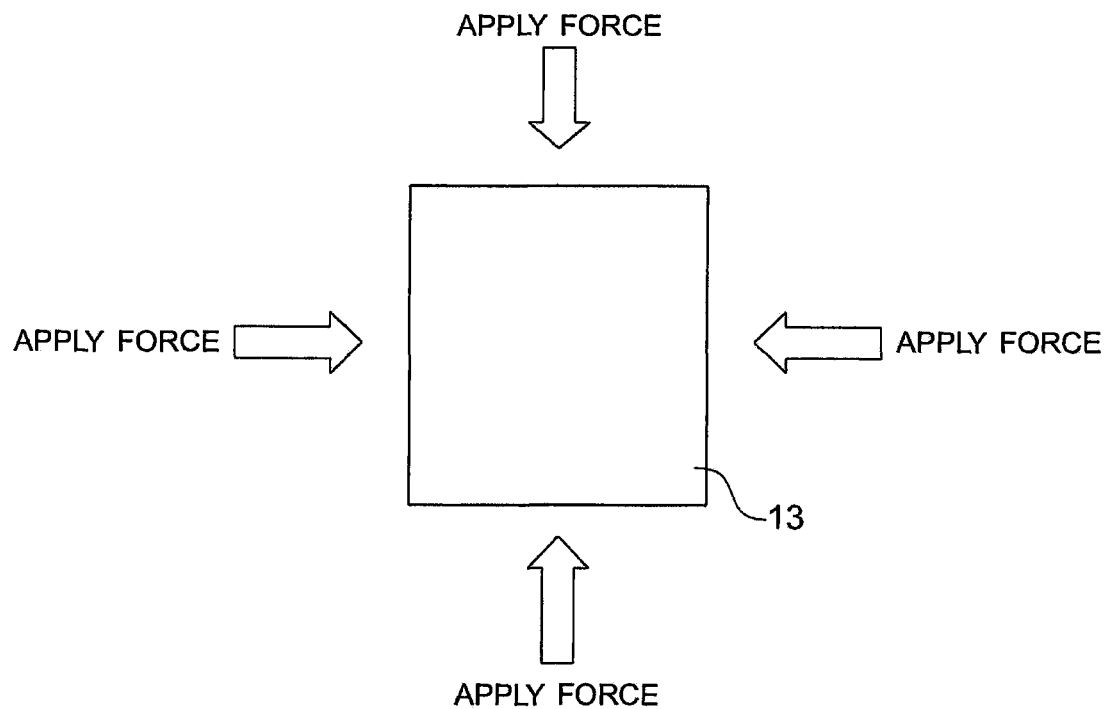
FIG. 2 is a diagram illustrating pressurization of a template.

FIG. 2 is a diagram viewed from above the template 13 brought into contact with the imprint material 12. The pressurizing mechanism may apply appropriate forces, respectively, from four directions (up direction, down direction, left direction, and right direction in the drawing) of the template.

Figures 3A, 3B:
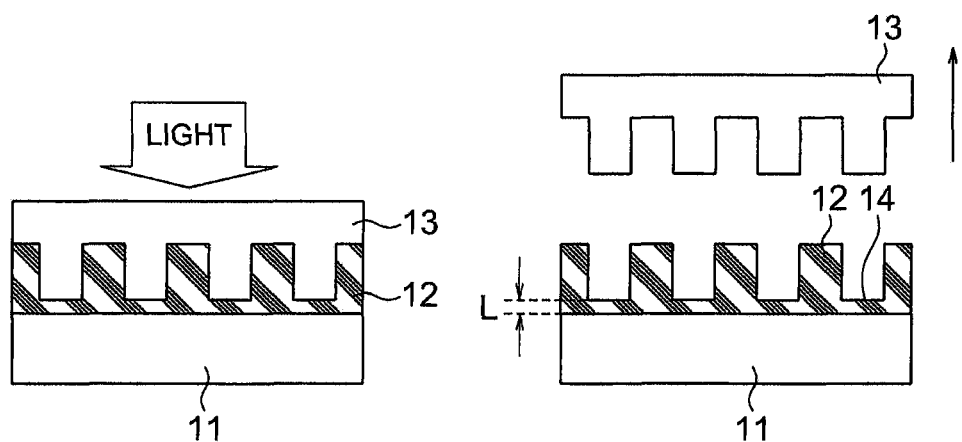
FIGS. 3A and 3B are process cross-sectional views illustrating an imprint method.

As illustrated in FIG. 3A, after the imprint material 12 fills the uneven pattern of the template 13, light is irradiated to cure the imprint material 12. Any irradiated light may be used as long as the irradiated light cures the imprint material 12. For example, ultraviolet light may be used. The template 13 is made of a light transmitting material, for example, quartz glass.

As illustrated in FIG. 3B, the template 13 is separated from the imprint material 12. In this state, the imprint material 12 is already cured. Therefore, the imprint material 12 is maintained in the state (shape) at the time when the template 13 was contacted. In this manner, the transcription pattern may be formed by the imprint processing.

By repeating the processes illustrated in FIGS. 1A to 1C and FIGS. 3A and 3B, a plurality of transcription patterns may be formed on the substrate 11.

Also, by performing the shape correction of the template 13 through the process illustrated in FIG. 1C, a position at which the transcription pattern is to be formed may be finely adjusted. This, for example, may reduce a misalignment between the transcription pattern by the imprint processing and a base pattern previously formed in the substrate 11.

In order to prevent the template 13 from directly contacting the substrate 11, as illustrated in FIG. 3B, a residual film 14 is formed by the imprint processing. In the following description, a thickness L of the residual film 14 will be referred to as a residual film thickness. The residual film thickness corresponds to a gap between the surface of the substrate 11 and the template 13 when the template 13 is brought into contact with the imprint material 12.

As the residual film thickness becomes thinner, the fluidity of the imprint material 12 is reduced in the process illustrated in FIG. 1C. In order to form the transcription pattern at a desired position, it is necessary to apply an appropriate force to the template 13, depending on the fluidity of the imprint material 12. In an embodiment of the invention, the transcription pattern is formed at a desired position by appropriately pressurizing the template 13.

Figure 4:
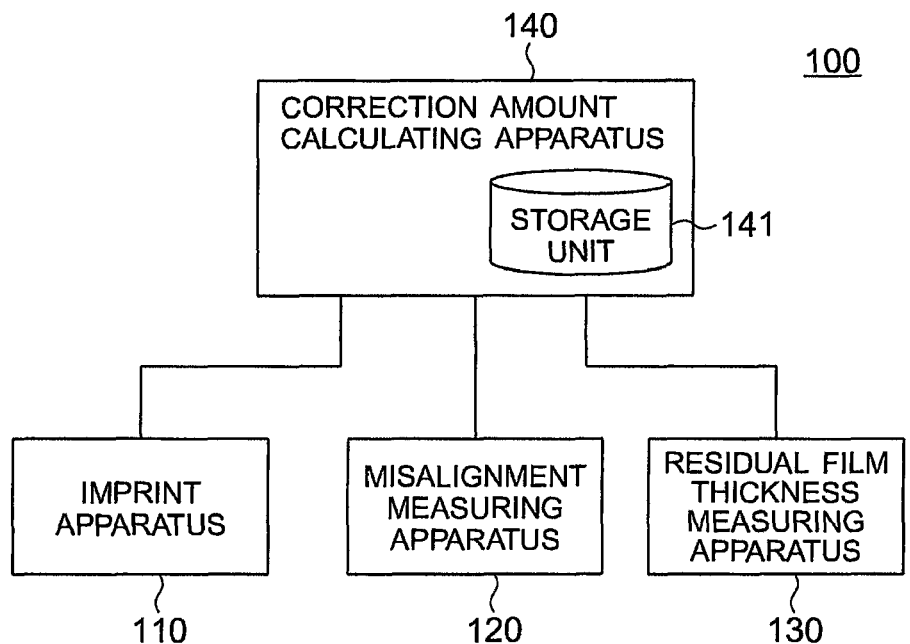
FIG. 4 is a schematic configuration diagram illustrating an imprint system according to an embodiment of the invention.

FIG. 4 illustrates a schematic configuration of an imprint system according to an embodiment of the invention. The imprint system 100 includes an imprint apparatus 110, a misalignment measuring apparatus 120, a residual film thickness measuring apparatus 130, and a correction amount calculating apparatus 140.

The imprint apparatus 110 is an apparatus that performs the imprint processing illustrated in FIGS. 1 to 3, and includes a coating unit configured to coat an imprint material, a shifting unit configured to shift a template, a light irradiating unit configured to irradiate light so as to cure the imprint material, and a pressurizing unit configured to correct the shape of the template by applying a force to the template.

The misalignment measuring apparatus 120 is an apparatus that measures a misalignment between a transcription pattern on a substrate and a base pattern formed in the substrate.

Figure 5:
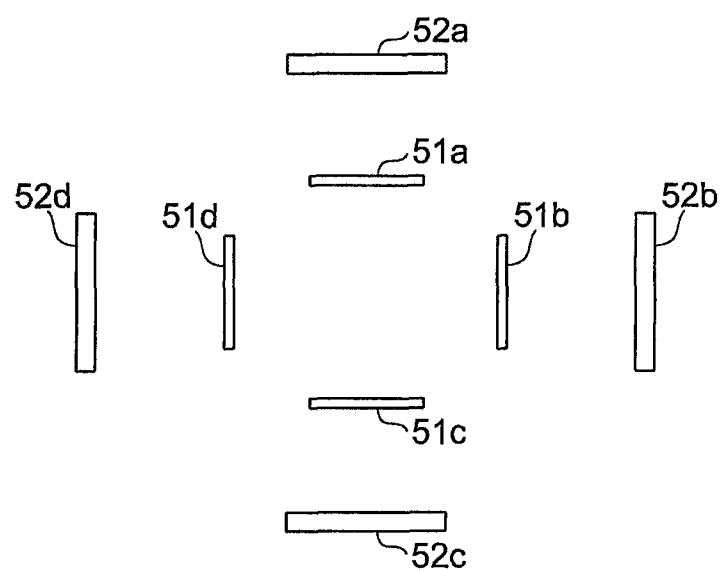
FIG. 5 is a diagram illustrating an example of a method for measuring misalignment of patterns.

For example, as illustrated in FIG. 5, dummy patterns 51a to 51d for inspection of misalignment are previously formed in the substrate. In addition, dummy patterns for inspection of misalignment are processed in the template, and dummy patterns 52a to 52d are formed in the substrate by an imprint processing.

The misalignment measuring apparatus 120 calculates central coordinates of the dummy patterns 51a to 51d and central coordinates of the dummy patterns 52a to 52d, and calculates a misalignment between the base pattern and the transcription pattern, based on a displacement between the central coordinates.

The method using such overlay marks is exemplary, and the misalignment measuring apparatus 120 may calculate misalignment using other methods.

The residual film thickness measuring apparatus 130 is an apparatus that measures a residual film thickness (thickness L of the residual film 14 of FIG. 3B). For example, the residual film thickness measuring apparatus 130 is an ellipsometer that irradiates light onto the residual film, measures a variation in a polarization state of incident light and reflected light, and calculates the film thickness from the measurement result. The residual film thickness measuring apparatus 130 measures a residual film thickness at a plurality of sites of a single transcription pattern formed by one-shot imprint processing.

The correction amount calculating apparatus 140 instructs the imprint apparatus 110 about a force (shape correction amount) applied to the template at the time of the imprint processing. In addition, the correction amount calculating apparatus 140 obtains the misalignment measurement result from the misalignment measuring apparatus 120, and obtains the residual film thickness measurement result from the residual film thickness measuring apparatus 130. In the case where a variation in the residual film thickness falls within a predetermined range and the misalignment is a predetermined value or less, the correction amount calculating apparatus 140 determines that the force (shape correction amount) applied to the template at the time of the imprint processing for forming the transcription pattern is an appropriate value, stores a combination of the force and the residual film thickness in the storage unit 141, and creates a database.

A method for creating a database defining a correspondence relation between the residual film thickness and the appropriate force applied to the template at the time of the imprint processing in the storage unit 141 will be described with reference to a flow chart illustrated in FIG. 6.

In step S101, a template, on which an uneven pattern processing is performed, is prepared.

In step S102, a residual film thickness at the time of an imprint processing is set.

In step S103, an imprint processing is performed so as to have the residual film thickness set in step S102, and a transcription pattern is formed on a substrate. The imprint processing is similar to the processes illustrated in FIGS. 1A to 1C and FIGS. 3A and 3B, and a predetermined force is applied to the template.

In step S104, the residual film thickness measuring apparatus 130 measures a residual film thickness at a plurality of sites of the transcription pattern formed in step S103. If a variation in measured values, an average value, and a center value fall within a predetermined range, the procedure proceeds to step S106. If not, the procedure proceeds to step S105.

In step S105, a coating amount or a coating position of an imprint material coated on the substrate by a coating unit of the imprint apparatus 110 are changed. The procedure returns to step S103, and the imprint processing is performed again.

In step S106, the misalignment measuring apparatus 120 measures a misalignment between the transcription pattern formed in step S103 and a base pattern formed in the substrate. If the misalignment amount is a predetermined value or less, the procedure proceeds to step S108. If greater than the predetermined value, the procedure proceeds to step S107.

In step S107, the force applied to the template in the imprint processing of step S103 is changed. Thereafter, the process returns to step S103, and the imprint processing is performed again.

In step S108, a combination of the residual film thickness set in step S102 and the force applied to the template at the time of the imprint processing of step S103 is stored in the storage unit 141. In this case, a combination of a coating amount, a coating position, and the like of the imprint material may also be stored in the storage unit 141.

In step S109, if continuing the database creating processing, the procedure returns to step S102, and the residual film thickness is changed. Thereafter, the processes of steps S103 to S108 are carried out.

Figure 7:
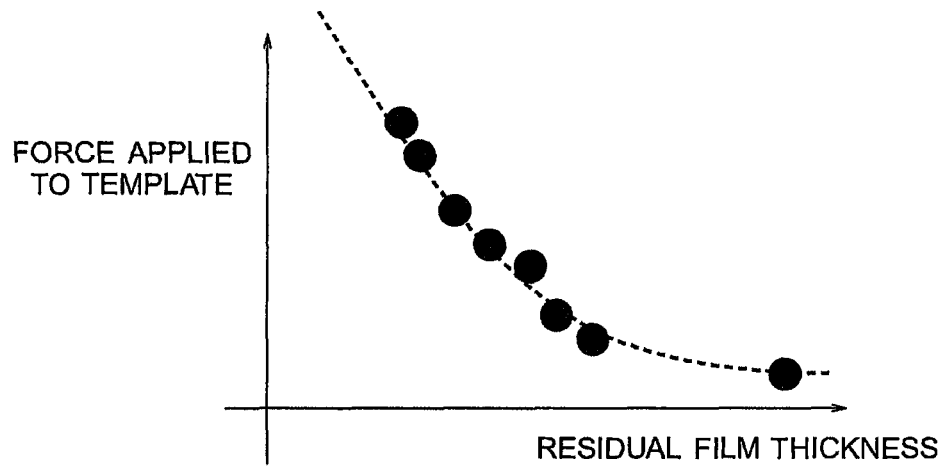
FIG. 7 is a graph illustrating an example of a relation between a force applied to a template and a residual film thickness.

In this manner, as illustrated in FIG. 7, the database defining the combination (correspondence relation) of the residual film thickness at the time of the imprint processing and the appropriate force applied to the template so as to reduce the misalignment between the transcription pattern and the base pattern may be created. It can be seen from FIG. 7 that as the residual film thickness is thinner, the force applied to the template is increased. This is because as the residual film thickness is thinner, the fluidity of the imprint material is reduced.

Figure 8:
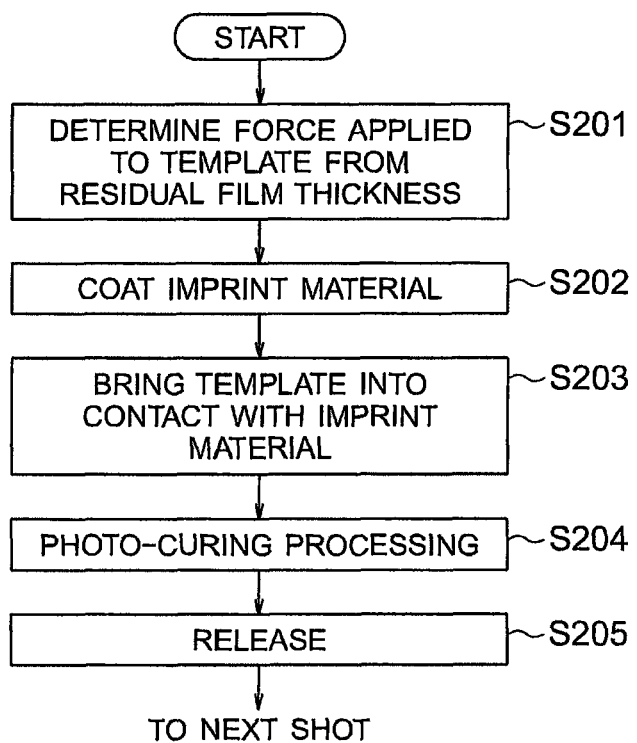
FIG. 8 is a flow chart illustrating the imprint method according to the embodiment.

Next, an imprint method (in mass production) referring to such a database will be described with reference to a flow chart illustrated in FIG. 8.

In step S201, the correction amount calculating apparatus 140 obtains the residual film thickness included in a processing condition set to the imprint apparatus 110. The imprint apparatus 110 may transmit information on the residual film thickness to the correction amount calculating apparatus 140, or a user may input the information on the residual film thickness to the correction amount calculating apparatus 140.

Thereafter, the correction amount calculating apparatus 140 extracts a shape correction amount (force applied to the template) corresponding to the residual film thickness obtained by searching the database of the storage unit 141. The correction amount calculating apparatus 140 instructs the imprint apparatus 100 about the extracted shape correction amount.

Also, the correction amount calculating apparatus 140 may obtain the coating position or coating amount from the database, and instruct the obtained coating position or coating amount to the imprint apparatus 100.

In step S202, the coating unit of the imprint apparatus 100 coats an imprint material on a substrate to be processed (film to be processed) (see FIG. 1A).

In step S203, the template is brought into contact with the imprint material coated on the substrate. Thereafter, alignment is performed with reference to the substrate and the alignment mark of the template (see FIG. 1B).

In step S204, the pressurizing unit of the imprint apparatus 100 applies a force to the template, based on the shape correction amount (force applied to the template) instructed in step S201 (see FIG. 1C).

In step S205, after the imprint material is filled within the uneven pattern of the template, the light irradiating unit of the imprint apparatus 100 irradiates light to cures the imprint material (see FIG. 3A).

In step S206, the template is released from the imprint material (see FIG. 3B).

By changing a shot position and repeating steps S201 to S206, a plurality of transcription patterns may be formed on the substrate to be processed.

This embodiment focuses on the variation in the fluidity of the imprint material according to the residual film thickness, and creates the database of the correspondence relation between the residual film thickness and the appropriate force applied to the template. The appropriate force corresponding to the residual film thickness is applied to the template in mass production or the like with reference to the database. Therefore, a misalignment between the base pattern previously formed in the substrate to be processed and the transcription pattern formed by the imprint processing may be reduced.

Therefore, according to this embodiment, the alignment accuracy of the transcription pattern may be improved.

In the above-described embodiment, although the shape correction amount of template (force applied to the template) is changed depending on the residual film thickness, a suitable shape correction amount is also changed depending on the density or aspect ratio of the uneven pattern processed in the template. Hence, by creating the database of the storage unit 141 in consideration of these conditions, the alignment accuracy of the transcription pattern may be further improved.

Figure 6:
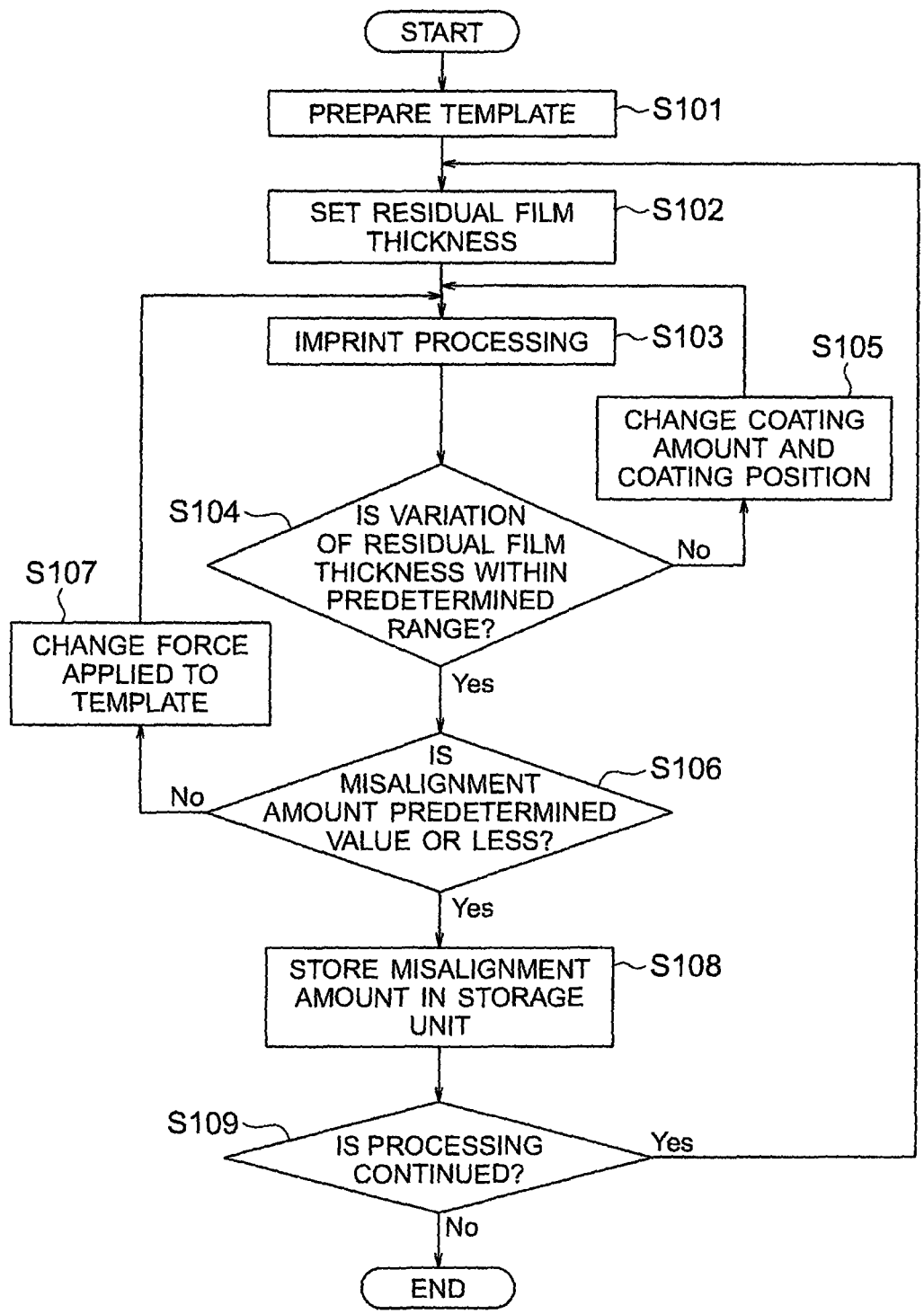
FIG. 6 is a flow chart illustrating a method for creating a database according to the embodiment.

In the above-described embodiment, as illustrated in FIG. 6, although the database of the storage unit 141 is created using a single template, a plurality of templates may be prepared and a database may be created with respect to each template. Moreover, by changing the type of the imprint material to be coated and performing the processing illustrated in FIG. 6, a database may be created with respect to each imprint material.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An imprint method comprising:
coating a first photo-curable organic material on a first film;
bringing a concave-convex pattern of a template into contact with the first photo-curable organic material having a first residual film thickness corresponding to a gap between a surface of the first film and the template;
applying a first force to side surfaces of the template;
creating a relation between the first force and the first residual film thickness;
coating a second photo-curable organic material on a second film to be processed;
bringing the concave-convex pattern of the template into contact with the second photo-curable organic material;
applying a second force to side surfaces of the template to correct a shape of the template, based on the relation between the first force and the first residual film thickness, in such a state that the template is brought into contact with the second photo-curable organic material;
curing the second photo-curable organic material by irradiating light onto the second photo-curable organic material, in such a state that the template is brought into contact with the second photo-curable organic material; and
releasing the template from the second photo-curable organic material after the light irradiation;
wherein the method further comprises:
before coating the second photo-curable organic material, coating a third photo-curable organic material on the first film;
bringing the concave-convex pattern of the template into contact with the third photo-curable organic material, the third photo-curable organic material having a second residual film thickness corresponding to a gap between the surface on the first film and the template;
applying a third force to the side surfaces of the template; and
creating a relation between the third force and the third residual film thickness,
wherein the second force is applied to the side surfaces of the template, based on the relation between the first force and the first residual film thickness and on the relation between the third force and the third residual film thickness.

2. The imprint method according to claim 1,
wherein an amount of the third photo-curable organic material is different from an amount of the first photo-curable organic material.

3. The imprint method according to claim 1,
wherein the template has a first side surface, a second side surface, a third side surface and a fourth side surface,
wherein the first to the third forces are applied to the first to fourth side surfaces.

4. An imprint method comprising:
coating a first photo-curable organic material on a first film;

bringing a concave-convex pattern of a template into contact with the first photo-curable organic material having a first residual film thickness corresponding to a distance between a surface of the first film and a surface of a concave portion of the first photo-curable organic material;

applying a first force to side surfaces of the template;

creating a relation between the first force and the first residual film thickness;

coating a second photo-curable organic material on a second film to be processed;

bringing the concave-convex pattern of the template into contact with the second photo-curable organic material;

applying a second force to side surfaces of the template, based on the relation between the first force and the first residual film thickness, in such a state that the template is brought into contact with the second photo-curable organic material;

curing the second photo-curable organic material by irradiating light onto the second photo-curable organic material, in such a state that the template is brought into contact with the second photo-curable organic material; and releasing the template from the second photo-curable organic material after the light irradiation;

wherein the method further comprises:

before coating the second photo-curable organic material, coating a third photo-curable organic material on the first film;

bringing the concave-convex pattern of the template into contact with the third photo-curable organic material, the third photo-curable organic material having a second residual film thickness corresponding to a distance between the surface of the first film and a surface of a concave portion of the third photo-curable organic material;

applying a third force to the side surfaces of the template; and creating a relation between the third force and the third residual film thickness, wherein the second force is applied to the side surfaces of the template, based on the relation between the first force and the first residual film thickness and on the relation between the third force and the third residual film thickness.

5. The imprint method according to claim 4, wherein an amount of the third photo-curable organic material is different from an amount of the first photo-curable organic material.

* * * * *